US012592560B2

(12) United States Patent
Shea

(10) Patent No.: US 12,592,560 B2
(45) Date of Patent: *Mar. 31, 2026

(54) UNIVERSAL PROTECTION FOR POWER SYSTEMS

(71) Applicant: Schneider Electric USA, Inc., Andover, MA (US)

(72) Inventor: John Shea, Wake Forest, NC (US)

(73) Assignee: Schneider Electric USA, Inc., Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/814,789

(22) Filed: Aug. 26, 2024

(65) Prior Publication Data

US 2026/0058465 A1     Feb. 26, 2026

(51) Int. Cl.
| | |
|---|---|
| *H02J 3/00* | (2006.01) |
| *G01R 31/52* | (2020.01) |
| *G01R 31/58* | (2020.01) |
| *H02J 3/0012* | (2026.01) |
| *H02J 13/00* | (2006.01) |

(52) U.S. Cl.
CPC ............ *H02J 3/0012* (2020.01); *G01R 31/52* (2020.01); *G01R 31/58* (2020.01); *H02J 13/0004* (2020.01)

(58) Field of Classification Search
CPC .... H02J 3/0012; H02J 13/0004; G01R 31/52; G01R 31/58; G01R 19/175
USPC ............................ 307/100, 326; 361/1, 5, 14
See application file for complete search history.

(56) References Cited

U.S. PATENT DOCUMENTS

| | | | |
|---|---|---|---|
| 2004/0070899 A1 | 4/2004 | Gershen et al. | |
| 2020/0365345 A1 | 11/2020 | Telefus et al. | |
| 2024/0264216 A1 * | 8/2024 | Guo .................. | G01R 31/1272 |
| 2025/0035694 A1 * | 1/2025 | Handy ................ | G01R 31/086 |

(Continued)

FOREIGN PATENT DOCUMENTS

| | | |
|---|---|---|
| CN | 1862937 A | 11/2006 |
| CN | 105675966 B | 3/2019 |
| CN | 114725885 A | 7/2022 |

(Continued)

OTHER PUBLICATIONS

Extended European Search Report for European Application No. 25195638.9 dated Jan. 23, 2026.

*Primary Examiner* — Rexford N Barnie
*Assistant Examiner* — Joshua James Sweet
(74) *Attorney, Agent, or Firm* — Wolf, Greenfield & Sacks, P.C.

(57) ABSTRACT
A system includes a transmission cable with a first main conductor wire. A sense wire is wrapped around the first main conductor wire with a sense resistor in series electrically with the sense wire. The transmission cable includes one or more additional main conductor wires each including a respective conductor. A protection system is operatively connected to the transmission cable, including a leakage current sensor circuit (LCSC) operatively connected to the sense wire to provide feedback indicative of current in the sense wire. A controller is operatively connected to provide feedback based control to a plurality of switching devices for fault protection. The controller is operatively connected to receive the feedback indicative of current in the sense wire from the LCSC for feedback based control of the plurality of switching devices.

20 Claims, 10 Drawing Sheets

(56)  References Cited

U.S. PATENT DOCUMENTS

2025/0226129 A1* 7/2025 Eshima ................. G01R 31/58

FOREIGN PATENT DOCUMENTS

| | | | |
|---|---|---|---|
| CN | 116482572 | B | 9/2023 |
| CN | 221304326 | U | 7/2024 |
| KR | 10-0616782 | B1 | 8/2006 |

* cited by examiner

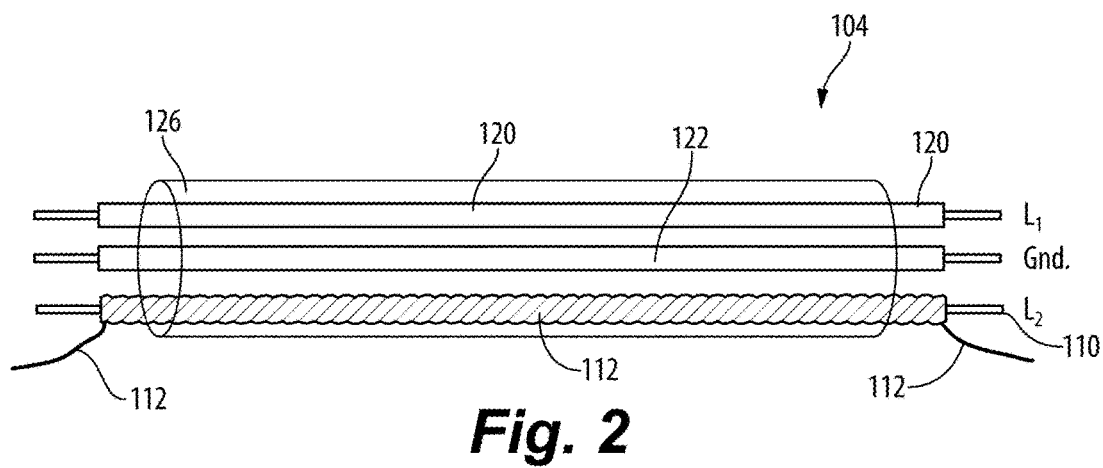
Fig. 2
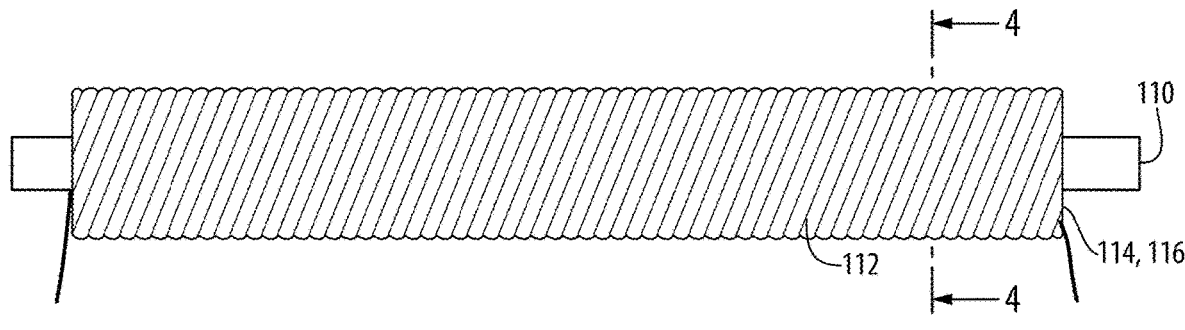
Fig. 3
Fig. 4

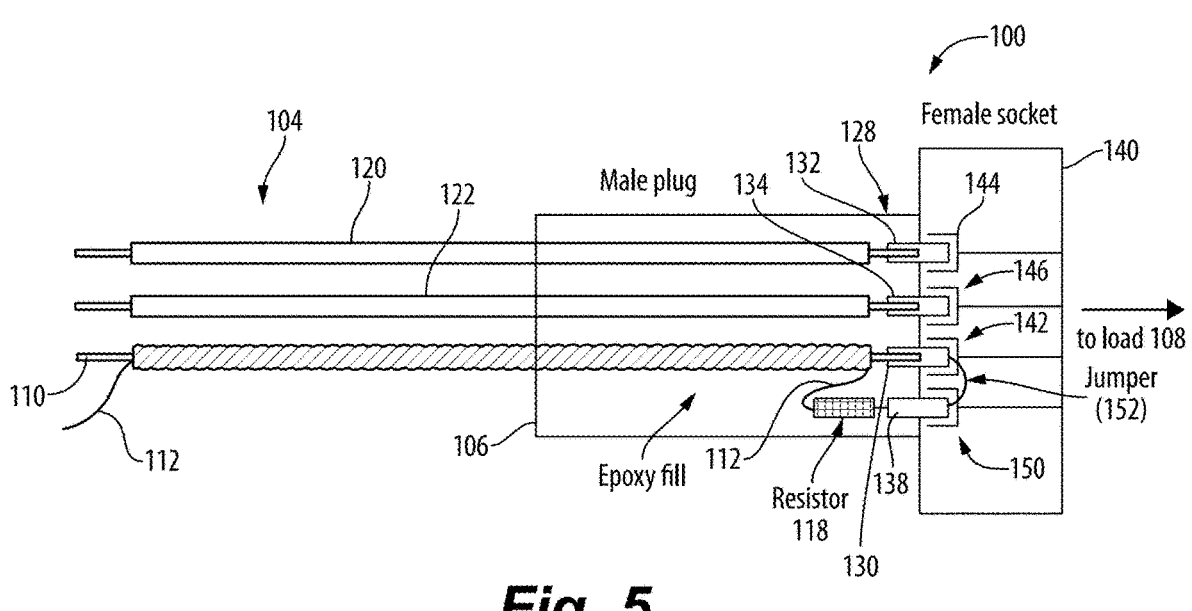
*Fig. 5*
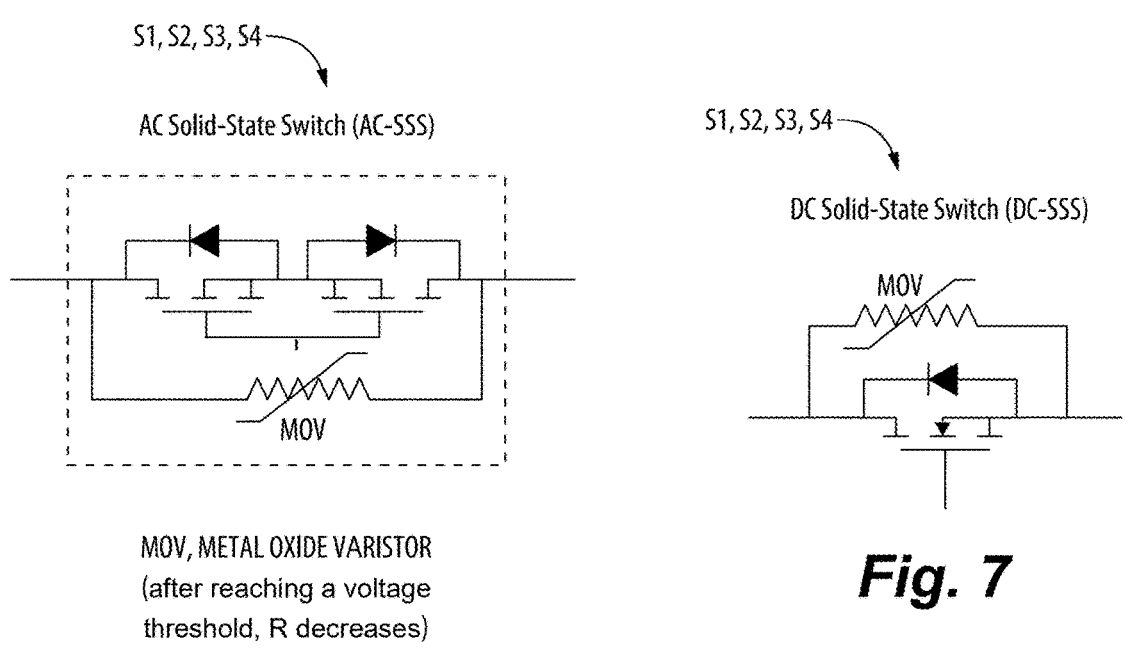
S1, S2, S3, S4
AC Solid-State Switch (AC-SSS)
MOV, METAL OXIDE VARISTOR
(after reaching a voltage
threshold, R decreases)
*Fig. 6*
S1, S2, S3, S4
DC Solid-State Switch (DC-SSS)
MOV
*Fig. 7*

UNIVERSAL PROTECTION FOR POWER SYSTEMS

BACKGROUND

1. Field

The present disclosure relates to power systems, and more particularly to protection such as shock protection for power systems such as fault managed power systems (FMPS).

2. Description of Related Art

Current inrush complicates fault protection for high power systems. For instance, the inrush current fluctuations in a typical power transmission line can resemble or exceed the current fluctuations in a fault event such as ground fault, arc fault, shock fault, short circuit, or the like. Fault protecting such systems can involve inrush limiters. There has been an ongoing need for making inrush limiters work well with fault detection and protection, e.g. that can detect and protect against faults from human touch contact with a power transmission line. This disclosure provides a solution for this need.

SUMMARY

A system includes a transmission cable including a connector at a load end of the transmission cable that is configured to connect the transmission cable electrically to a load to supply power from a power source to the load. The transmission cable includes a first main conductor wire within a first wire insulator. A sense wire is wrapped around the first wire insulator with a sense resistor in series electrically with the sense wire. The transmission cable includes one or more additional main conductor wires each including a respective conductor within a respective wire insulator, and a cable insulator disposed about a bundle that includes the first main conductor wire, the sense wire, and the one or more additional main conductor wires.

A protection system is operatively connected to the transmission cable. The protection system includes a leakage current sensor circuit (LCSC) operatively connected to the sense wire to provide feedback indicative of current in the sense wire. A controller is operatively connected to provide feedback based control to a plurality of switching devices operatively connected to the first line and to the one or more additional lines for fault protection. The controller is operatively connected to receive the feedback indicative of current in the sense wire from the LCSC for feedback based control of the plurality of switching devices.

The protection system can include a first breaker device in a first line in electrical series between a first node configured to connect to the power source and the first main conductor wire. A second breaker device can be in a second line in electrical series between a second node configured to connect to the power source and a second main conductor wire that is one of the one or more additional main conductor wires.

The connector of the transmission cable can include a cable plug. The cable plug can include a first plug terminal electrically connected to a connection end of the first main conductor wire and one or more additional plug terminals respectively connected electrically to a connection end of each one of the one or more additional main conductor wires. A sense plug terminal can be electrically connected to the sense wire. The sense resistor can be in electrical series between the sense plug terminal and the sense wire.

A load plug can be configured to connect to the cable plug. The load plug can include a first load terminal in electrical contact with the first plug terminal for conducting power from the first main conductor wire to a load. One or more additional load terminals can be respectively in electrical contact with the one or more additional plug terminals for conducting power from the one or more additional main conductor wires to the load. A load sense terminal can be in electrical contact with the sense plug terminal. A jumper can electrically connect the first load terminal with the load sense terminal for conduction between the first main conductor wire and the sense wire through the sense resistor.

The sense wire can include insulated magnet wire. The sense wire can be wrapped, with no spacing, around the first main conductor wire to form a shield. The LCSC can include a voltage source, a first LCSC resistor electrically in series between the sense resistor and the voltage source, and a second LCSC resistor electrically connected to a first LCSC node between the voltage source and the first resistor. The second LCSC resistor can electrically connect between the first LCSC node and ground. A metal oxide varistor (MOV) can be electrically connected in parallel with the second LCSC resistor. Current sensing logic can be operatively connected to detect current passing through the first LCSC resistor and to output feedback indicative of current to the controller.

The plurality of switching devices can include a first switching device in the first line, a second switching device in a second line that is one of the one or more additional lines, a third switching device in a switch line connecting electrically between the first and second lines, and a fourth switching device in the switch line, electrically in series between the third switching device and the second line. The protection system can include a main sensor operatively connected to the first and second lines to generate feedback for the controller indicative of current differential among the first and second lines. The controller can be operatively connected to control switching of the first, second, third, and fourth switching devices and to control the first and second breaker devices for fault protection based on feedback from the main sensor.

The controller can include machine readable instructions configured to cause the controller to: check the integrity of the transmission cable and connection of the transmission cable to the load by measuring the current feedback from the LCSC;

upon detecting current within an expected range, and upon detecting current imbalance magnitude below a predetermined limit in feedback from the main sensor, close the first and second switches to power the load;

upon detecting current imbalance magnitude above the predetermined limit in feedback from the main sensor or upon detecting lack of current in the sense wire, open the first and second switches and close third and fourth switches to short out the main transmission cable and shunt current away from the cable, load, and possible fault;

initiate a fault indicator for a predetermined time; and after a fault, make a first attempt to restart including detecting current imbalance magnitude below a predetermined limit in feedback from the main sensor, and closing the first and second switches during a system voltage zero-crossing to power the load.

Upon failure of the first attempt, the instructions can be configured to cause the controller to repeatedly attempt to restart up to three times. Upon three failed attempts to restart, the instructions can be configured to cause the controller to trip the first and second breaker devices.

A first inrush limiter can be included in the first line in electrical series between the first breaker device and the first switching device. A second inrush limiter can be included in the second line in series between the second breaker device and the second switching device. A zero-crossing line can connect from a first zero-crossing node in the first line between the first inrush limiter and the first switching device to a node in the second line between the second inrush limiter and the second switching device. A first zero-crossing detector in the zero-crossing line can be in electrical series between the first and second zero-crossing nodes. A second zero-crossing detector in the zero-crossing line can be in electrical series between the first zero-crossing detector and the second zero-crossing node. The first and second inrush limiters can be operatively connected to be controlled by the controller. The first and second zero-crossing detectors can be operatively connected to the controller to communicate feedback to the controller for timing zero-crossing current for the first and second lines.

The first inrush limiter can include a first inrush resistor in parallel with a first inrush relay, each connected in electrical series in the first line between the first breaker device and the first zero-crossing detector. The second inrush limiter can include a second inrush resistor in parallel with a second inrush relay, each connected in electrical series in the second line between the second breaker device and the second zero-crossing detector.

The first inrush limiter can include a first inrush resistor in parallel with a first solid state inrush switch, each connected in electrical series in the first line between the first breaker device and the first zero-crossing detector. The second inrush limiter can include a second inrush resistor in parallel with a second solid state inrush switch, each connected in electrical series in the second line between the second breaker device and the second zero-crossing detector.

The first inrush limiter can include a first solid state inrush switch unit connected in electrical series in the first line between the first breaker device and the first zero-crossing detector. The second inrush limiter can include a second solid state inrush switch unit in electrical series in the second line between the second breaker device and the second zero-crossing detector. Each of the first and second inrush switch units can include, respectively:

a normally open MOSFET with a gate driver operatively connected to a gate of the MOSFET to control switching state of the MOSFET with a metal oxide varistor (MOV) in parallel with the normally open MOSFET; or
  a normally closed JFET in electrical series with the normally open MOSFET and MOV with a gate driver operatively connected to a gate of the JFET to control switching state of the JFET with a resistor in electrical parallel with the JFET and in electrical series with the normally open MOSFET and MOV.

A ground line in the protection system can be configured to be electrically connected to a ground. The one or more additional main conductor wires can include a ground conductor wire electrically connected to the ground line.

A neutral line in the protection system can run from a ground node, to a node in electrical series between the first and second zero-crossing detectors, to a node in electrical series between the third and fourth solid state switches, and through the main sensor. The one or more additional main conductor wires can include a neutral wire electrically connected to the neutral line.

The controller can include machine readable instructions configured to cause the controller to perform fault managed power supply (FMPS) functionality in the protection system for the power source and load. The controller can include machine readable instructions configured to cause the controller to perform ground fault circuit interrupt (GFCI) functionality in the protection system for the power source and load. The controller can include machine readable instructions configured to cause the controller to perform arc fault circuit interrupt (AFCI) functionality in the protection system for the power source and load. The controller can include machine readable instructions configured to cause the controller to perform solid state circuit breaker (SSCB) functionality in the protection system for the power source and load.

The first line can include a positive single pair ethernet in (SPE-IN+) node between the third switching device and the main sensor. The second line can include a negative single pair ethernet in (SPE-IN−) node between the fourth switching device and the main sensor. A single pair ethernet (SPE) RX/TX component can be operatively connected to the SPE-IN+ and SPE-IN− nodes to communicate data through the transmission cable.

In an AC configuration, the power source is an AC power source. A zero-crossing line can connect from a first zero-crossing node in the first line between the first breaker device and the first switching device to a node in the second line between the second breaker device and the second switching device. A first zero-crossing detector can be included in in the zero-crossing line in electrical series between the first and second zero-crossing nodes. A second zero-crossing detector can be included in the zero-crossing line is in electrical series between the first zero-crossing detector and the second zero-crossing node. The first and second zero-crossing detectors can be operatively connected to the controller to communicate feedback to the controller for timing zero-crossing current for the first and second lines. A ground line in the protection system can be configured to be electrically connected to a ground, wherein the one or more additional main conductor wires includes a ground conductor wire electrically connected to the ground line. The controller can include machine readable instructions configured to cause the controller to perform AC fault managed power supply (AC FMPS) functionality in the protection system for the power source and load.

The controller can include machine readable instructions configured to cause the controller to: check the integrity of the transmission cable and connection of the transmission cable to the load by measuring the current feedback from the LCSC;

upon detecting current within an expected range, and upon detecting current imbalance magnitude below a predetermined limit in feedback from the main sensor, close the first and second switches to power the load using feedback from the first and second zero-crossing detectors to time closing the first and second switches to coincide with a zero-crossing current in the first and second lines;
  upon detecting current imbalance magnitude above the predetermined limit in feedback from the main sensor or upon detecting lack of current in the sense wire, open the first and second switches and close third and fourth switches to short out the main transmission cable and shunt current away from the cable, load, and possible fault;

initiate a fault indicator for a predetermined time; and after a fault, make a first attempt to restart including detecting current imbalance magnitude below a predetermined limit in feedback from the main sensor, and close the first and second switches during a system voltage zero-crossing to power the load. The instructions can be configured to cause the controller to upon failure of the first attempt, repeatedly attempt to restart up to three times, and upon three failed attempts to restart, trip the first and second breaker devices.

In a DC configuration, a first inrush limiter can be included in the first line in electrical series between the first breaker device and the first switching device. A second inrush limiter can be included in the second line in series between the second breaker device and the second switching device. The first and second inrush limiters can be operatively connected to be controlled by the controller. The controller can include machine readable instructions configured to cause the controller to perform DC fault managed power supply (FMPS) functionality in the protection system for the power source and load.

The first inrush limiter can include a first inrush resistor in parallel with a first solid state inrush switch, each connected in electrical series in the first line between the first breaker device and the first switching device. The second inrush limiter can include a second inrush resistor in parallel with a second solid state inrush switch, each connected in electrical series in the second line between the second breaker device and the second switching device.

A ground line in the protection system can be configured to be electrically connected to a ground, wherein the ground line is connected to a node in electrical series between the third and fourth solid state switches, but circumvents the main sensor. The one or more additional main conductor wires can include a ground conductor wire electrically connected to the ground line. The controller can include machine readable instructions configured to cause the controller to:

check the integrity of the transmission cable and connection of the transmission cable to the load by measuring the current feedback from the LCSC;

upon detecting current within an expected range, and upon detecting current imbalance magnitude below a predetermined limit in feedback from the main sensor, close the first and second switches during;

after a predetermined inrush time, command the first and second solid state inrush switches to close, shunting the first and second inrush resistors;

upon detecting current imbalance magnitude above the predetermined limit in feedback from the main sensor or upon detecting lack of current in the sense wire, open the first and second switches and close third and fourth switches to short out the main transmission cable and shunt current away from the cable, load, and possible fault, and open the first and second solid state inrush switches;

initiate a fault indicator for a predetermined timeout time; and after a fault, make a first attempt to restart including detecting current imbalance magnitude below a predetermined limit in feedback from the main sensor, and closing the first and second switches to power the load. Upon failure of the first attempt, the machine readable instructions can be configured to cause the controller to repeatedly attempt to restart up to three times and upon three failed attempts to restart, trip the first and second breaker devices.

A first inrush resistor can be in the first line in electrical series between the first breaker device and the first switching device, e.g. without an inrush switch or relay. A second inrush resistor can be in the second line in series between the second breaker device and the second switching device. The controller can include machine readable instructions configured to cause the controller to use pulse width modulation (PWM) control of the first and second switching devices to charge load capacitance for inrush control. The controller can include machine readable instructions configured to cause the controller to perform DC fault managed power supply (FMPS) functionality in the protection system for the power source and load.

The first inrush limiter can include a first inrush resistor in parallel with a first solid state inrush switch, each connected in electrical series in the first line between the first breaker device and the first zero-crossing detector. The second inrush limiter can include a second inrush resistor in parallel with a second solid state inrush switch, each connected in electrical series in the second line between the second breaker device and the second zero-crossing detector. The first and second solid state inrush limiters can be operatively connected to the controller through a driver for controlling inrush. The controller can include machine readable instructions configured to cause the controller to perform fault managed power supply (FMPS) functionality and ground fault circuit interrupt (GFCI) functionality in the protection system for the power source and load.

The first inrush limiter can include a first inrush switching device in electrical series between the first breaker device and the first switching device. The second inrush limiter can include a second inrush switching device in electrical series between the second breaker device and the second switching device. The controller can include machine readable instructions configured to cause the controller to use pulse width modulation (PWM) control of the first and second inrush switches during startup to limit inrush. The first inrush limiter can include a first inrush switching device in electrical series between the first breaker device and the first switching device. The second inrush limiter can include a second inrush switching device in electrical series between the second breaker device and the second switching device. The controller can include machine readable instructions configured to cause the controller to modulate MOSFET resistance in the first and second inrush switching devices by modulating gate voltage to limit current magnitude.

The power source can be an AC power source. The protection system can include a third breaker device in a third line in electrical series between a third node configured to connect to the power source and a third main conductor wire that is one of the one or more additional main conductor wires. The third line can pass through the main sensor. The plurality of switching devices can include a fifth switching device in the third line, and a sixth switching device in connecting from the third line to a switch line node in the switch line in series between the third and fourth switches. A first zero-crossing node can be included in the first line between the first breaker device and the first switching device. A second zero-crossing node can be included in the second line between the second breaker device and the second switching device. A third zero-crossing node can be included in the third line between the third breaker device and the fifth switching device. A first zero-crossing detector can be included in electrical series between the first zero-crossing node and a fourth zero-crossing node. A second zero-crossing detector can be included in electrical series between the second and fourth zero-crossing nodes. A third zero-crossing detector can be included in electrical series between the third and fourth zero-crossing nodes. The first, second, and third zero-crossing detectors can be operatively connected to the controller to communicate feedback to the controller for timing zero-crossing current for the first, second, and third lines. The system can include a second LSCS operatively connected to a second sense wire operatively connected to a second main conductor wire that is one of the one more additional main conductor wires and a third LSCS operatively connected to a third sense wire operatively connected to a third main conductor wire that is one of the one or more additional main conductor wires. The controller can be operatively connected to receive the feedback indicative of current in the second and third sense wires from the second and third LCSC's, respectively, for feedback based control of the plurality of switching devices.

A ground line in the protection system can be configured to be electrically connected to a ground and not passing through the main sensor. The one or more additional main conductor wires can include a ground conductor wire electrically connected to the ground line. A neutral line in the protection system can run from the ground node, to the fourth zero-crossing node, to the switch line node, and through the main sensor. The one or more additional main conductor wires can include a neutral wire electrically connected to the neutral line.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIG. 2 is a schematic perspective view of a portion of the transmission cable of FIG. 1, showing the sense wire around one of the main conductor wires;

FIG. 3 is a schematic side elevation view of the sense wire and main conductor wire of FIG. 2;

FIG. 4 is a schematic end elevation view of the sense wire and main conductor wire of FIG. 3, showing the insulation;

FIG. 5 is a schematic view of a portion of the system of FIG. 1, showing the connection of the transmission cable to the load;

FIG. 6 is a schematic view of a solid state switch suitable for AC or DC applications in the plurality of switching devices of FIG. 1;

FIG. 7 is a schematic view of a solid state switch suitable for DC-only applications in the plurality of switching devices of FIG. 1;

DETAILED DESCRIPTION OF THE PREFERRED EMBODIMENTS

Figure 1:
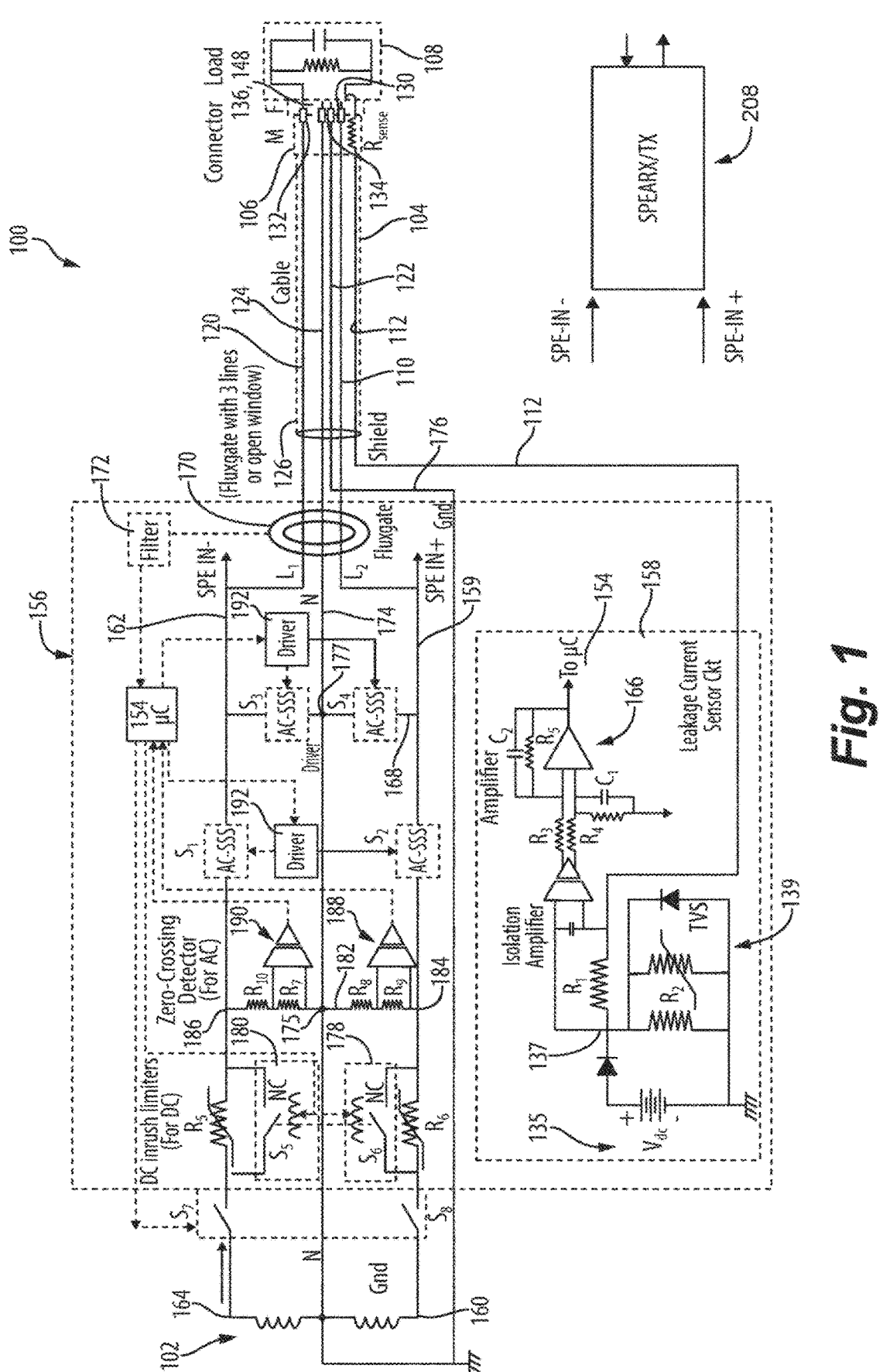
FIG. 1 is a schematic view of an embodiment of a system constructed in accordance with the present disclosure, showing the protection system and transmission cable configured for universal AC/DC operation.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIGS. 2-15, as will be described. The systems and methods described herein can be used to provide fault managed power system (FMPS) functionality for AC and DC systems including protection for faults such as shock faults due to human contact with power lines.

A system 100 includes a power source 102, which is shown as an alternating current (AC) source, but can be any suitable AC or direct current (DC) source such as a generator, battery, inverter, rectifier, or the like. The system 100 includes a transmission cable 104 including a connector 106 at a load end of the transmission cable 104 that is configured to connect the transmission cable 104 electrically to a load 108 to supply power from a power source 102 to the load 108.

With reference to FIG. 2, the transmission cable 104 includes a first main conductor wire 110 within a first wire insulator 114. A shield and sense wire 112 is disposed around the first wire insulator, e.g. wrapped around as a spiral wound as shown in FIG. 3.. The sense wire 112 can have a wire insulator of its own, and as shown in FIG. 4, can be layered outside a metal shield 116 of the main conductor wire 110. The sense wire 112 can include and insulated magnet wire, e.g., #32 AWG (American Wire Gage), or any other suitable type of wire. The sense wire 112 can be wrapped, e.g. with no spacing, around the first main conductor wire 110 to form a shield as shown in FIG. 3.

A sense resistor 118 is included in series electrically with the sense wire 112, although if the sense wire 112 is long enough, the inherent resistance in the sense wire 112 itself may constitute the sense resistor 118. The transmission cable 104 includes one or more additional main conductor wires 120, 122, 124 (labeled in FIG. 1) each including a respective conductor within a respective wire insulator, and a cable insulator 126 (labeled in FIGS. 1 and 2) disposed about a bundle that includes the first main conductor wire 110, the sense wire 112, and the one or more additional main conductor wires 120, 122, 124.

With reference now to FIG. 5, the connector 106 of the transmission cable 104 includes a male cable plug 128. The cable plug 128 includes a first plug terminal 130 electrically connected to a connection end of the first main conductor wire 110 and one or more additional plug terminals 132, 134, 136 respectively connected electrically to a connection end of each one of the one or more additional main conductor wires 120, 122, 124 (terminal 136 and main conductor wire 124 are labeled in FIG. 1). A sense plug terminal 138 is electrically connected to the sense wire 112. The sense resistor 118 is in electrical series between the sense plug terminal 138 and the sense wire 112.

With continued reference to FIG. 5, a female load plug 140 is configured to connect to the cable plug 128. Those skilled in the art will readily appreciate that the maleness/femaleness of the plugs 128, 140 can be reversed without departing from the scope of this disclosure. The load plug 140 includes a first load terminal 142 in electrical contact with the first plug terminal 130 for conducting power from the first main conductor 110 wire to the load 108. One or more additional load terminals 144, 146, 148 (labeled in FIG. 1) is/are respectively in electrical contact with the one or more additional plug terminals 132, 134,136 for conducting power from the one or more additional main conductor wires 120, 122, 124 to the load 108. A load sense terminal 150 is in electrical contact with the sense plug terminal 138. A jumper 152 electrically connects the first load terminal 142 with the load sense terminal 150 for conduction between the first main conductor wire 110 and the sense wire 112 through the sense resistor 118 when the cable plug 128 is connected to the load plug 140, so the controller 154 (labeled in FIG. 1) can detect whether the transmission cable 104 is connected to the load 108, and for providing current feedback to the controller 154.

With reference again to FIG. 1, a protection system 156 is operatively connected to the transmission cable 104. The protection system 156 includes the controller 154 and a leakage current sensor circuit (LCSC) 158 operatively connected to the sense wire 112 to provide feedback indicative of current in the sense wire to the controller 154. The protection system 156 includes a first breaker device S8 in a first line 159 in electrical series between a first node 160 configured to connect to the power source 102 and the first main conductor wire 110. A second breaker device S7 is in a second line 162 in electrical series between a second node 164 configured to connect to the power source 102 and a second main conductor wire 120.

The controller 154, e.g. a microcontroller or the like, is operatively connected to provide feedback based control to a plurality of switching devices S1, S2, S3, and S4 operatively connected to the first and second lines 159, 162 for fault protection. The controller 154 is operatively connected to receive the feedback indicative of current in the sense wire 112 from the LCSC 158 for feedback based control of the plurality of switching devices S1, S2, S3, S4. This sense resistor 118, in combination with resistors R1 and R2 of the LCSC are used to detect that the transmission cable 104 is connected to a load 108 with the corresponding connector 106 and that there are no shorted turns between the sense wire 112 and the main conductor 110, based on current through the sense resistor 118. The sense resistor 118 also provides resistance so that more than half of the fault current goes through the sense wire 112 back to the source circuit, e.g. first line 159, rather than being shunted by the main conductor 110. This allows the fault current to be detected by measuring the voltage across R1 in the LCSC 158.

A line-to-line fault, meaning human touch across main line conductors 110 and 120 can only occur if the insulation in both wires 110 and 120 is compromised. This would occur either through the insulation becoming worn down from abrasion, cut through, chemically dissolved, or overheated and melted exposing the metallic conductors. Because of the fine wire 112 used for the spiral design of the sense wire which is wrapped around the main conductor 110 and the thin insulation used on the sense wire, with no spacing between turns, the sense wire acts as a shield around the main conductor 110 as shown in FIGS. 2 and 3. The sense wire insulation can easily become compromised and expose the metal conductor caused by the above-mentioned factors causing the sense wire conductor to either become connected to the other line conductor 120 through human touch before human touch contact can occur with the inner main conductor 110. The sense wire 112 can also be broken. So, a human touch fault between the main line conductors 110 and 120 is detected by one of two methods: first, by measuring the voltage across the resistor R1 (at node 137) created by an increase in current through the sense wire 112 when human contact occurs across line 120 and the exposed sense wire; and secondly, when the sense wire is broken and no longer conducts current back to the resistor R1 (at node 137). These two conditions are monitored and if the current through the sense wire either exceeds a predetermined threshold indicating that human touch occurred between the main conductor 120 and the exposed sense wire 112 or the current stops flowing in the sense wire 112 indicating that the sense wire 112 was either broken, cut, or connector 106 was disconnected from the mating connector then the main current to the load 108 is turned off by opening switches S1 and S2 and closing S3 and S4 to discharge the cable 104 and the load 108. It is also contemplated that, an annular braided metallic shield, e.g. as shown in FIG. 4, which is connected to the spiral shield wire 112 at the end of cable 126 adjacent to the protection system 156, can be added as shown to ensure that human touch occurs with the metallic shield before touching the inner main conductor 110. This metallic shield also allows for larger pitch spacing between turns of the spiral sense wire 112. The spiral sense wire then acts to detect a broken sense wire from abrasions or cuts and checks to insure the connector is properly connected to a valid load.

The LCSC 158 includes a voltage source 135, a first LCSC resistor R1, e.g., 100Ω, electrically in series between the sense resistor 118 and the voltage source 135, and a second LCSC resistor R2, e.g., 1.5κΩ, electrically connected to a first LCSC node 137 between the voltage source 135 and the first resistor R1. The second LCSC resistor R2 electrically connects between the first LCSC node 137 and ground. A metal oxide varistor (MOV) 139, or the like, is electrically connected in parallel with the second LCSC resistor R2 for voltage limiting in the LCSC 158. Current sensing logic 166 is operatively connected to detect current passing through the first LCSC resistor R1 and to output feedback indicative of current to the controller 154. The logic 166 includes including an LCSC amplifier, an isolation amplifier, and the associated resistors and capacitors as shown in FIG. 1.

The plurality of switching devices S1, S2, S3, S4 can be solid-state switches such as shown in FIG. 6 which can be used for either AC or DC applications. In DC only applications, the solid-state switch configuration shown in FIG. 7 can be used. The switching device S2 is in the first line 159 and the switching device S1 is in the second line 162. The third and fourth switching devices S3, S4 are in a switch line 168 connecting electrically between the first and second lines 159, 162. The switch line 168 is between the transmission cable 104 and the power source 102, with the first and second switches S2, S1 between the switch line 168 and combined breaker devices S7, S8 and power source 102. The switching device S3 is in the switch line 168, electrically in series between the switching device S4 and the second line 162.

The first line 159 includes a positive single pair ethernet in (SPE-IN+) node between the line 168 of the switching device S4 and the main sensor 170. The second line 162 includes a negative single pair ethernet in (SPE-IN−) node between the line 168 of the switching device S3 and the main sensor 170. A single pair ethernet (SPE) RX/TX component 208 can optionally be operatively connected to the SPE-IN+ and SPE-IN− nodes to communicate data through the transmission cable 104.

The protection system 156 includes a main sensor 170, which is universal for both AC and DC applications, but could be replaced with a current transformer (CT) for AC only applications. The main sensor 170 is operatively connected to the first and second lines 159, 162 to generate feedback, e.g. through an amp or filter 172, for the controller 154 indicative of current differential among the first and second lines 159, 162, the neutral line 174, ground line 176, and any respective additional line such as described below. The controller 154 is operatively connected through drivers to control switching of the switching devices S1, S2, S3, S4 and to control the first and second breaker devices S7, S8 for fault protection based on feedback from the main sensor 170 and from the LCSC 158.

A first inrush limiter 178 is included in the first line 159 in electrical series between the breaker device S8 and the switching device S2. A second inrush limiter 180 is included in the second line 162 in series between the breaker device S7 and the switching device S1. The first inrush limiter 178 includes a first inrush resistor R6 in parallel with a normally closed (NC) inrush relay S6, each connected in electrical series in the first line 159 between the breaker device S8 and the first zero-crossing node 184. The second inrush limiter 180 includes a second inrush resistor R5 in parallel with a second inrush relay S5, each connected in electrical series in the second line 162 between the breaker device S7 and the second zero-crossing node 186. Each of the inrush resistors R5, R6 can be a negative temperature coefficient (NTC) thermistor, or the like.

A zero-crossing line 182 connects from a first zero-crossing node 184 in the first line 159 between the first inrush limiter 178 and the switching device S2 to a node 186 in the second line 162 between the inrush limiter 180 and the switching device S1. A first zero-crossing detector 188 is in the zero-crossing line 182 and is in electrical series between the first and second zero-crossing nodes 184, 186 via resistor R8 and resistor R9. A second zero-crossing detector 190 is in the zero-crossing line 182 and is in electrical series between the first zero-crossing detector 188 and the second zero-crossing node 186. The second zero-crossing detector 190 is in electrical series between the first and second zero-crossing nodes 184, 186 via resistor R10 and resistor R7. The neutral line 174 connects to the neutral zero-crossing node 175 that is in electrical series between the first and second zero-crossing detectors 188, 190, which is also grounded. The neutral line 174 also connects to a node 177 in series in the line 168 between the switching devices S3, S4. The first and second inrush limiters 178, 180 are operatively connected to be controlled by the controller 154 to limit inrush, e.g., in DC operation. The first and second zero-crossing detectors 188, 190 are operatively connected to the controller 154 to communicate feedback to the controller 154 for timing zero-crossing current for the first and second lines 159, 162 for inrush limiting, e.g. in AC operation.

The controller 154 includes machine readable instructions, e.g. digital code, digital logic, analog logic, or the like, configured to cause the controller to closing the switches S7 and S8 (which can be part of an arc-fault circuit interrupter (ACFI) breaker) to turn on the internal power supplies. Once the supplies are fully charged and the controller 154 is running, the controller 154 checks the integrity of the transmission cable 104 and connection of the transmission cable 104 to the load 108 by measuring the current feedback from the LCSC 158.

Upon detecting current feedback from the LCSC 158 indicative of current through the sense wire 112 within an expected range, e.g., 1 mA±0.2 mA, and upon detecting current imbalance with a magnitude below a predetermined limit, e.g., below 5 mA, in feedback from the main sensor 170, the controller commands close the switches S1 and S2 to power the load 108. In the case of AC operations, this includes using feedback from the first and second zero-crossing detectors 188, 190. Point on wave control, made possible by the zero-crossing measurement, is used to reduce any inrush. Thus, in AC operation, the inrush limiters 178, 180 are not necessarily needed.

At this point, the system 100 is started up and operates under normal conditions, powering load 108 with the power supply 102. Upon detecting a current imbalance magnitude above the predetermined limit in feedback from the main sensor 170, the controller 154 commands open the switches S1, S2 and commands closed the normally open switches S3, S4 to short out the main transmission cable 104 and shunt current away from the main transmission cable 104, the load 108, and possible fault within the required time.

Similarly, after a successful startup, the controller 154 can detect faults such as from human touch in feedback from the main sensor 170, wherein some of the current passes through the human body to either ground, in the case of a line-to-ground fault, or between the first main conductor wire 110 and the sense wire 112, in the case of a line-to-line fault. In either case, a portion of the line current, depending on the human body impedance, is shunted around the main sensor 170 creating an imbalance in the differential current through the main sensor 170 creating a voltage output from the main sensor 170 that can be measured by the controller 154. If the controller determines the feedback from the main sensor 170 is indicative of voltage beyond a predetermined fault voltage limit, the controller 154 can command the switches S1, S2 to open and the switches S3, S4 to close, effectively eliminating the fault current through the human or whatever created the fault. The time taken to operate the switches S1, S2, S3, S4 depends on the magnitude of the measured voltage from the main sensor 170 corresponding to the magnitude of the fault current. Then the controller 154 initiates a fault indicator for a predetermined time, e.g., 3 seconds.

After a fault, and the expiration of the fault indicator, the controller 154 make a first attempt to restart including detecting current imbalance magnitude below the predetermined limit, e.g., below 5 mA in feedback from the main sensor 170, and closing the switches S1, S2, e.g. during a system voltage zero-crossing in AC applications as described above to power the load 108. Upon failure of the first attempt, the machine readable instructions are configured to cause the controller 154 to repeatedly attempt to restart up to three times, waiting for the fault indicators each time there is a fault detected. Upon three failed attempts to restart, the machine readable instructions are configure to cause the controller 154 to trip the breaker devices S7, S8. The system 100 is thus locked out and must be manually restarted after the fault is removed or any issue resolved. Gate drivers 192, capable of sensing semiconductor saturation, are used to protect the semiconductor switches S1, S2, S3, S4 and the transmission cable 104 in the event of a short-circuit. Additionally, other features can be incorporated into the system 100, such as overload, by adding a current transformer to the main conductor wire 110 and adding additional program instructions in the controller 154 to meet a desired overload trip curve resulting in a solid-state combination arc fault/ground fault circuit breaker. It is also contemplated that the existing overload protection in the breaker devices S7, S8 (e.g. in an AFCI breaker) can be used.

Figure 8:
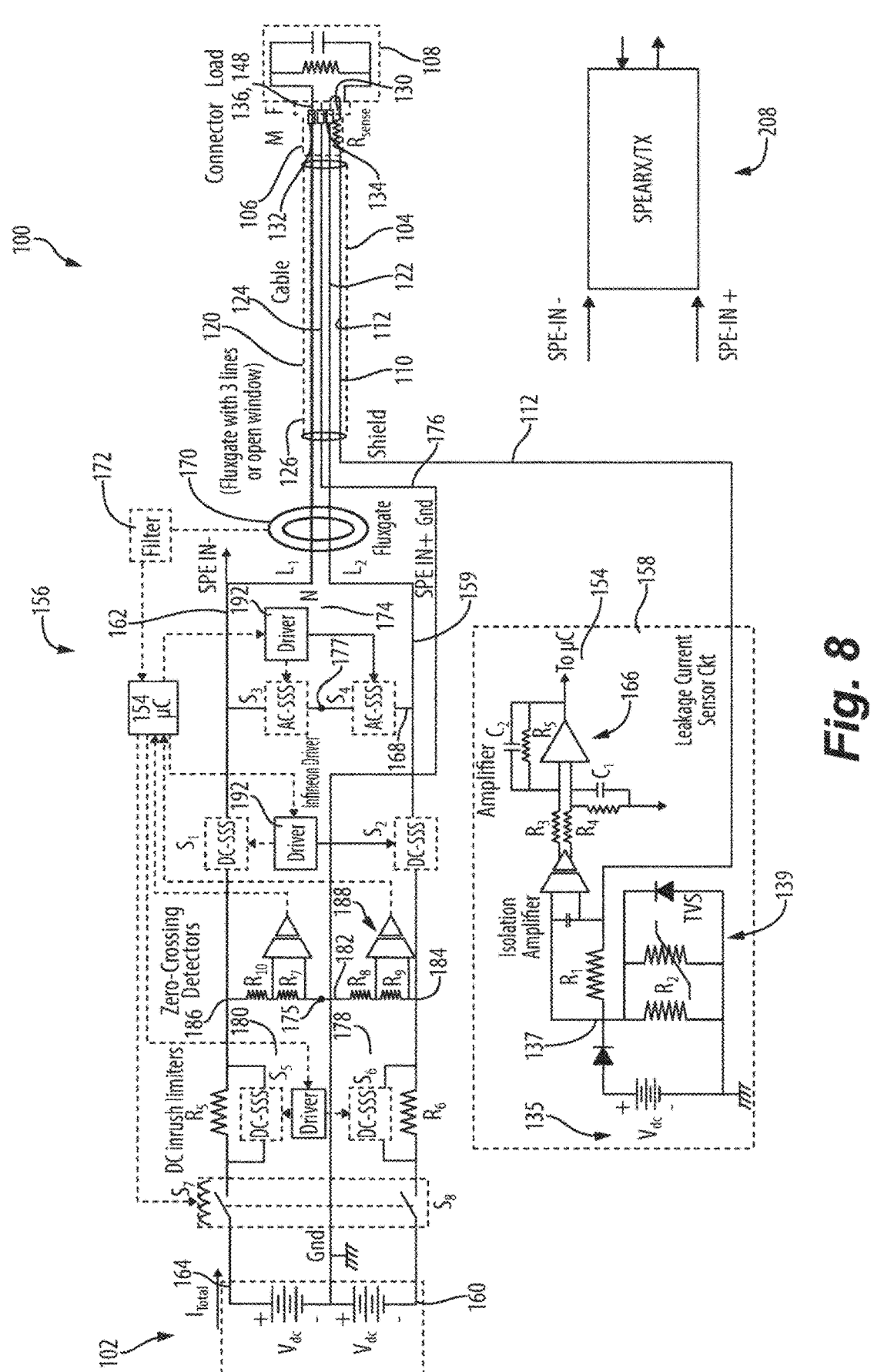
FIG. 8 is a schematic view of the system of FIG. 1, showing a configuration without the neutral line that can be used for AC or DC operation.

The system as configured in FIG. 1 is universal to one or two phase AC, unipolar DC, or bipolar DC. AC operation is described above, and DC operation is described below. In the configuration of FIG. 1, the controller 154 includes machine readable instructions configured to cause the controller to perform functionality for fault managed power systems (FMPS), ground fault circuit interrupters (GFCI), arc-fault circuit interrupters (AFCI), and solid state circuit breakers (SSCB). It is possible so simplify the system 100, e.g. to have just combined FMPS/GFCI functionality. The configuration in FIG. 8, represents this simplified configuration. In FIG. 8, the switches S1, S2, S3, S4 are shown as solid state DC switches (DC-SSS), which can be configured as shown in FIG. 7. The power source 102 is shown as a DC power source, however AC-SSS switches and in FIG. 6 and an AC power source could instead be used for AC operation. The neutral line 174 of FIG. 1 is omitted and instead, the ground line 176 connects through neutral zero-crossing node 175. In FIG. 8, the first and second inrush limiters 178, 180 each include a respective first inrush resistor R5, R6 in parallel with a respective solid state inrush switch S5, S6 each connected in electrical series with the respective line 159, 162 as described above for FIG. 1.

Figure 9:
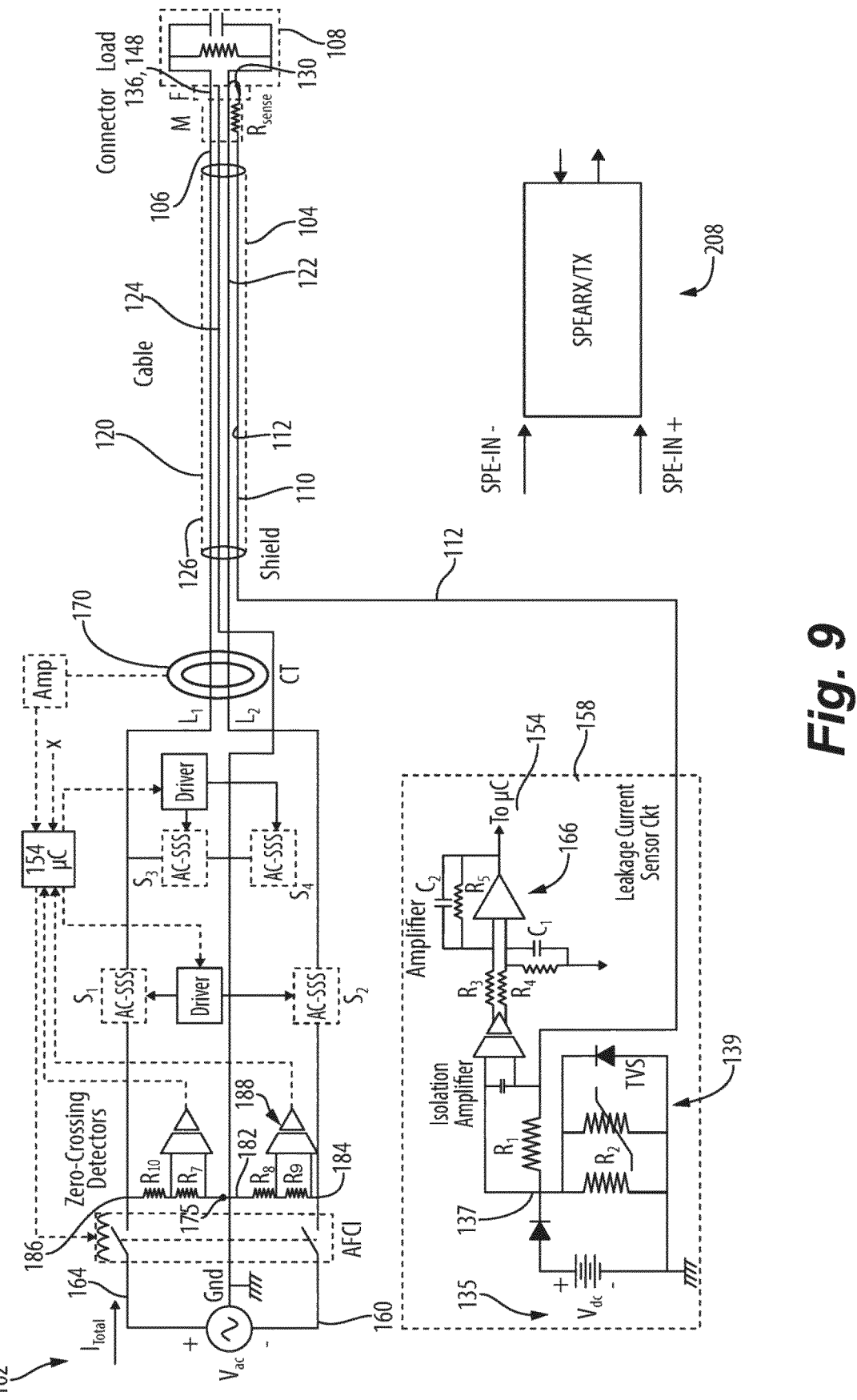
FIG. 9 is a schematic view of the system of FIG. 1, showing an AC-only configuration.

With reference to FIG. 9, a configuration of the system 100 is shown, configured for dedicated AC operation. In an AC configuration, the power source 102 is an AC power source. There are no inrush limiters needed, given the zero-crossing timing can be used in AC operation as a measure to limit inrush. The ground line 176 can be electrically connected to a ground, does not pass through the main sensor 170 in this configuration, but does connect nodes 175, 177 to ground. In this configuration, there is no dedicated neutral line 174 as in FIG. 1. The controller 154 includes machine readable instructions configured to cause the controller to perform AC fault managed power supply (AC FMPS) functionality in the protection system 156 for the power source 102 and load 108. AC operation of the configuration in FIG. 9 is the same as the AC operation described above with reference to FIGS. 1 and 8.

Figure 10:
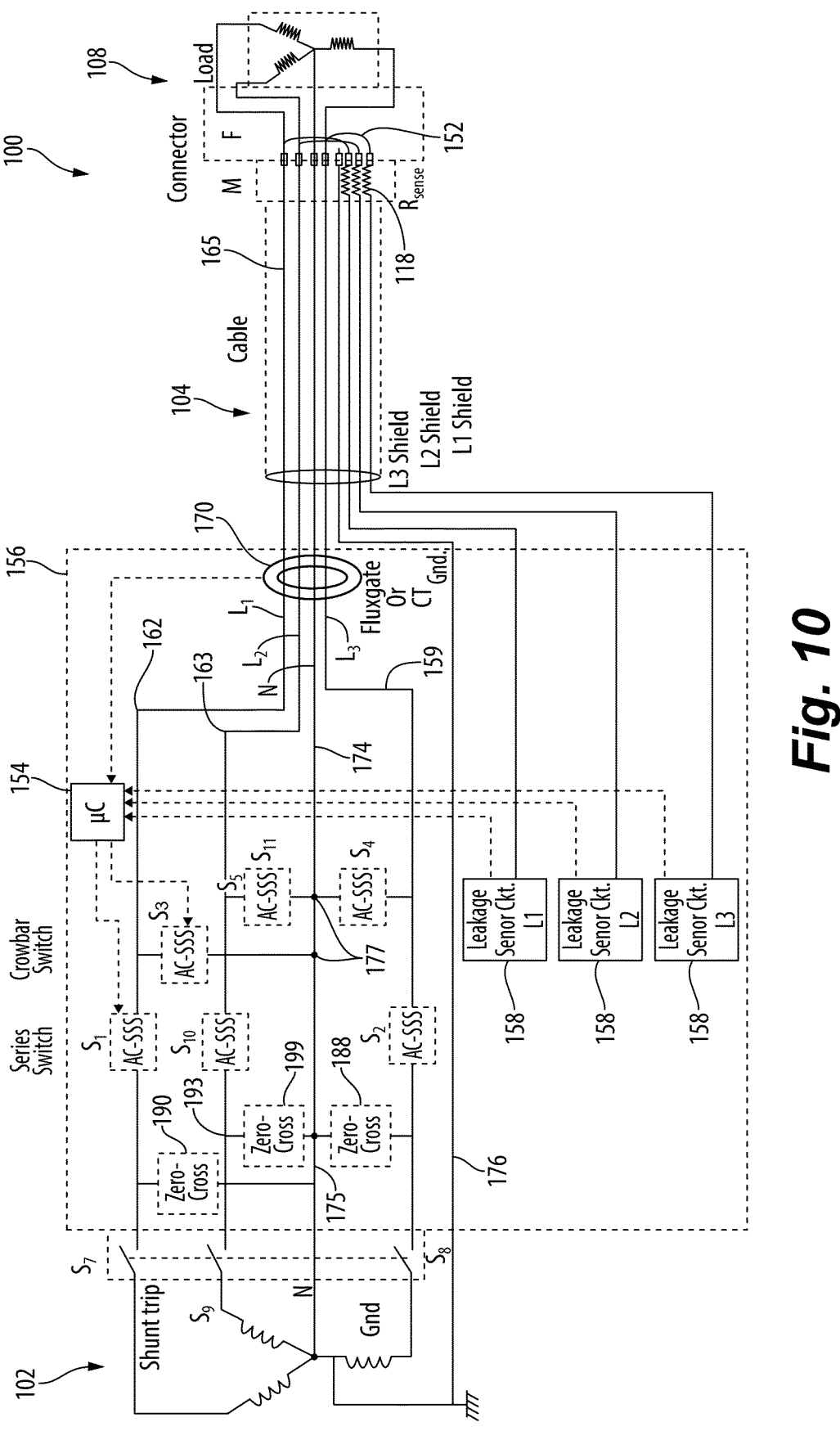
FIG. 10 is a schematic view of the system of FIG. 1, showing a 3-phase AC configuration.

With reference now to FIG. 10, the system 100 can be configured for three-phase AC operation, with two of the phases, neutral, and ground, much as described above with respect to FIG. 1, but there is no need for inrush limiters. The protection system 156 includes a third breaker device S9 in a third line 163 in electrical series between a third node configured to connect to the power source 102 and a third main conductor wire 165 that is one of the one or more additional main conductor wires in the transmission cable 104. The third line 163 passes through the main sensor 170.

In addition to the switching devices S1 and S2 described above with respect to FIG. 1, a third switching device S10 is in the third line 163 between the power source 102 and the main sensor 170. In addition to the first and second zero-crossing detectors 188, 190 described above, a third zero-crossing detector is connected from a third zero-crossing node 193 in the third line 163 (between the breaking device S9 and the switching device S10) and the zero-crossing node 175. All three of the third zero-crossing detectors 188, 190, 199 are operatively connected to the controller 154 to communicate feedback to the controller for timing zero-crossing current for the first, second, and third lines 159, 162, 163. In addition to the LCSC 158 of FIG. 1, two additional LCSC's 158 are included, one each for the second and third lines 162, 163, respectively. The transmission cable 104 includes respective conductors and sense wires 112, with sense resistors 118 and jumpers 152 as described above with respect to FIG. 1 for the first line 159. The additional main conductor wires each include respective plug terminals for connecting to the load 108. The controller 154 is operatively connected to receive the feedback indicative of current in the second and third sense wires 112 from the second and third LCSC 158, respectively, for feedback based control of the plurality of switching devices S1, S2, S3, S4, S10, S11.

DC operation of the system 100 of FIGS. 1 and 8 is the same as for AC operation described above, but with the addition of use of the inrush circuit is added which operates as follows. After the breaker devices S7, S8 are closed and the power supplies and controller 154 are charged, the controller 154 commands the starting sequence as in the AC operation however, after a predetermined time, e.g. a few hundred milliseconds, the controller 154 commands the inrush switching devices S5 and S6 to close, after the inrush has been limited, shunting the current-limiting resistors R5 and R6, to reduce power loss produced by the inrush limiting resistors R5 and R6. Also, unlike AC operation described above, there is no zero-crossing detection or timing needed. Upon any fault, the controller commands the inrush switching devices S5 and S6 to open, resetting for the next inrush cycle. The breaker devices S7, S8 can be optionally be modified if needed to provide for DC arc protection.

Figure 11:
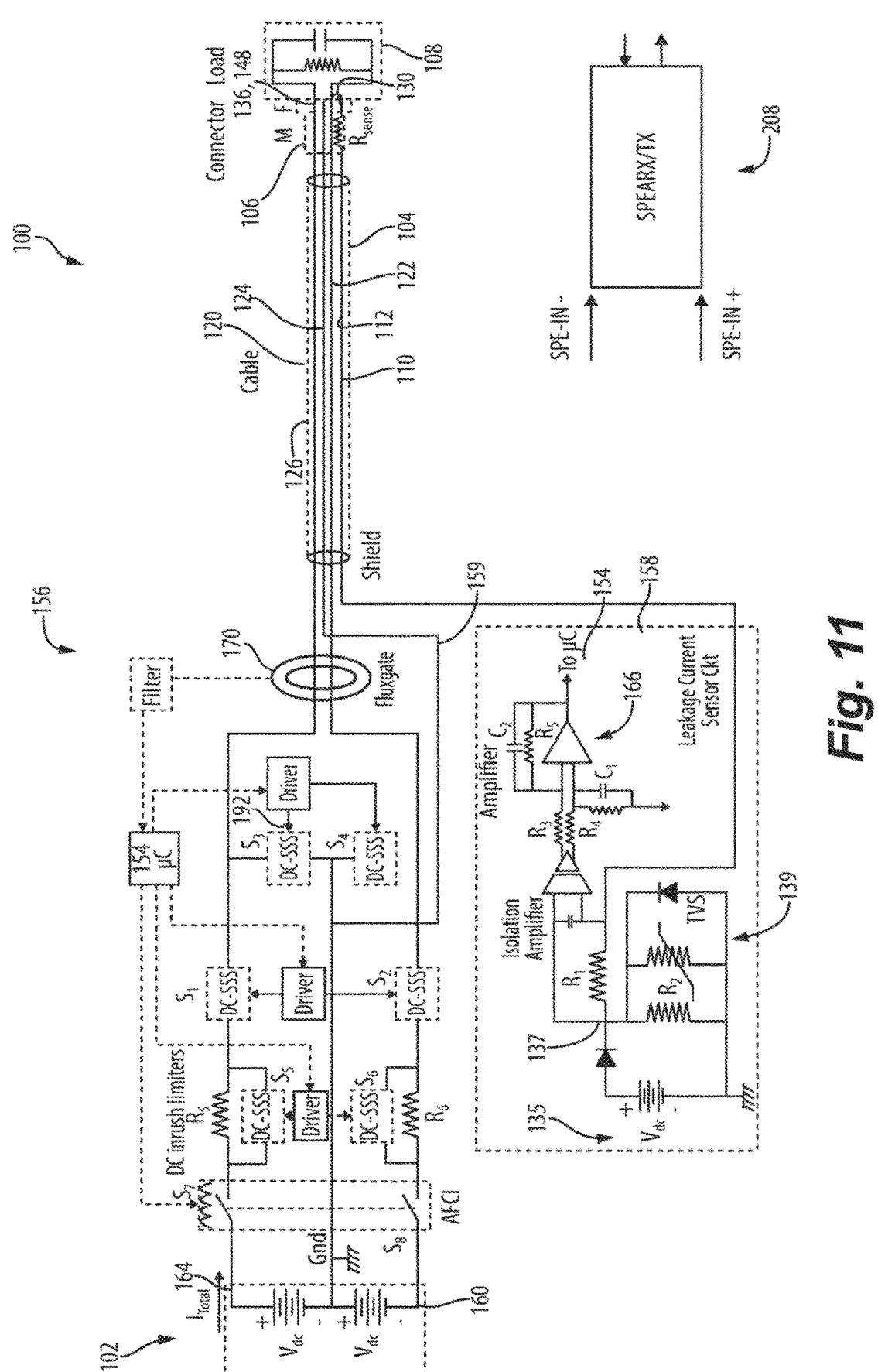
FIG. 11 is a schematic view of the system of FIG. 1, showing a DC-only configuration with inrush limiters but no zero-crossing detectors.
Figure 12:
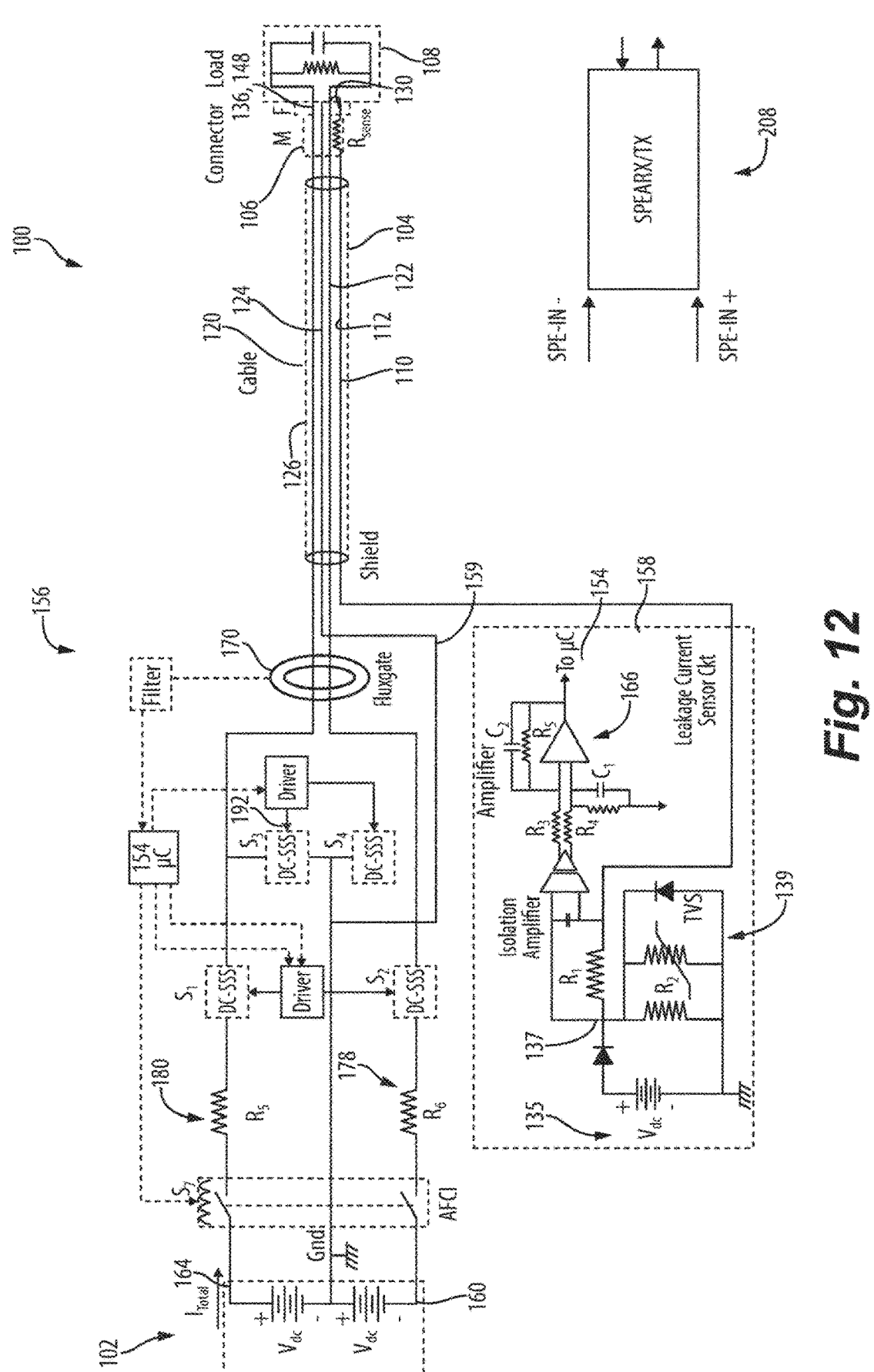
FIG. 12 is a schematic view of the system of FIG. 1, showing a DC-only configuration with resistors for inrush limiting in conjunction with operation of solid state switching devices.

FIG. 11 shows a dedicated DC configuration, where the zero-point detectors are omitted. Also, the switching devices S3, S4 have a node in series between them connected to the ground line 176. This configuration is capable of DC operation with FMPS functionality. The first and second inrush limiters 178, 180 are operatively connected to be controlled by the controller 154 with a driver. The ground line 176 is connected to a node 177 in electrical series between the switching devices S3, S4, but circumvents the main sensor 170. In FIG. 12, which shows a configuration of the system 100 for dedicated DC operation, the inrush limiters are further simplified and have the same functionality as in FIG. 11. The first inrush resistor R6 is in the first line 159 in electrical series between the first breaker device S8 and the switching device S2. The inrush resistor R5 is in the second line 162 in series between the breaker device S7 and the switching device S1. The controller 154 includes machine readable instructions configured to cause the controller 154 to use pulse width modulation (PWM) control of the switching devices S1, S2 to charge load capacitance for inrush control. In addition to or in lieu of the resistors R5 and R6 in FIG. 12, a respective inrush switching device S5, S6 (labeled in FIG. 8) can be in electrical series between the first breaker devices S7, S8 and the switching devices S1 and S2, respectively. The controller 154 includes machine readable instructions configured to cause the controller to use pulse width modulation (PWM) control of the switching devices S1, S2, or if applicable, S5, S6 (labeled in FIG. 8), during startup to limit inrush. This modulates the gate drivers based on measured peak current. Once steady-state is reached PWM is transitioned to steady-state constant gate voltage.

Figures 14, 15:
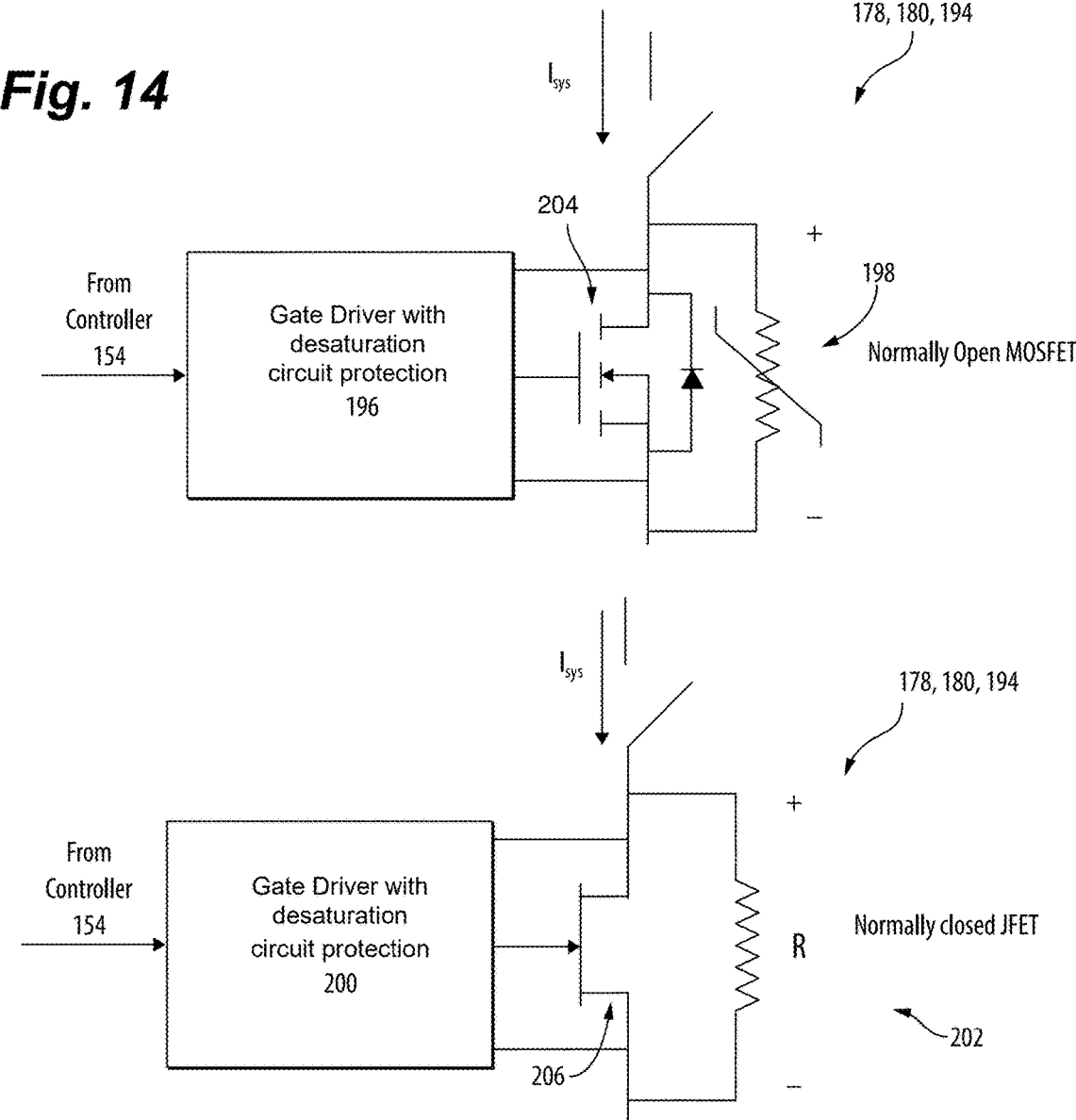
FIG. 14 is a schematic view of a portion of the system of FIG. 1, showing a solid state inrush limiter configuration.
FIG. 15 is a schematic view of a portion of the system of FIG. 1, showing a solid state inrush limiter configuration.

FIG. 14 shows an embodiment for a dc inrush limiter that can be used in lieu of the other inrush limiters disclosed herein, e.g. for switching devices S1 and S2 in FIG. 8. FIG. 14 shows an inrush limiter that can be used for two different inrush limiter techniques. The first is the MOSFET being modulated by applying a PWM signal to the gate to pulse the load current to gradually charge up the load towards the system voltage. Feedback from the charging voltage to the gate drive controller would determine the width and rate of the PWM signal until either the load is fully charged and the MOSFET is fully turned on or the controller times out and indicates a fault. In the second technique, gate voltage can be ramped to control the let-through charging current by varying the device resistance.

With continued reference to FIG. 14, a first solid state inrush switch unit 194 is connected in electrical series, e.g. one in each of the lines 159, 162 of FIG. 8, between a breaker device and a first zero-crossing detector, or it is also contemplated that the switching devices S1 and S2 can also be utilized as the inrush limiter during startup using the above mentioned methods. The inrush switch unit 194 is on option for inrush limiting and includes a normally open (NO) MOSFET 204 with a normally open desaturation circuit with gate driver 196 operatively connected to a gate of the MOSFET 204 (and to the controller 154) to control switching state of the MOSFET 204. A metal oxide varistor (MOV) 198 is connected in parallel with the normally open MOSFET 204.

With reference now to FIG. 15, in another option for inrush limiting, a normally closed (NC) JFET 206 has a gate driver 200 operatively connected to a gate of the JFET 206 (and to the controller 154) to control switching state of the JFET 206. A resistor 202 is connected in electrical parallel with the JFET 206. This configuration works by initially turning off the JFET 206 by applying a negative gate voltage before S1 and S2 in FIG. 8 or 11 are turned on, for example. Then S1 and S2 are turned on with the parallel resistor 202 in the circuit, limiting the inrush current. Then either the JFET 206 can be operated in one of two modes: keep the gate voltage negative to keep the JFET 206 open (off) until the inrush current subsides then turn the gate voltage off to close the JFET 206 and short out 202; or PWM the gate voltage to switch the resistor 202 in and out of the circuit to pulse charge the load. In FIGS. 14-15, in the case of inrush limiters/units 194 being used, for example in place of the inrush resistors R5 and R6 of FIG. 12, the controller 154 can include machine readable instructions configured to cause the controller 154 to modulate MOSFET/JFET resistance in the first and second inrush switching devices by modulating gate voltage to limit current magnitude in a soft-start circuit configuration, and/or PWM control of the gate voltage.

Figure 13:
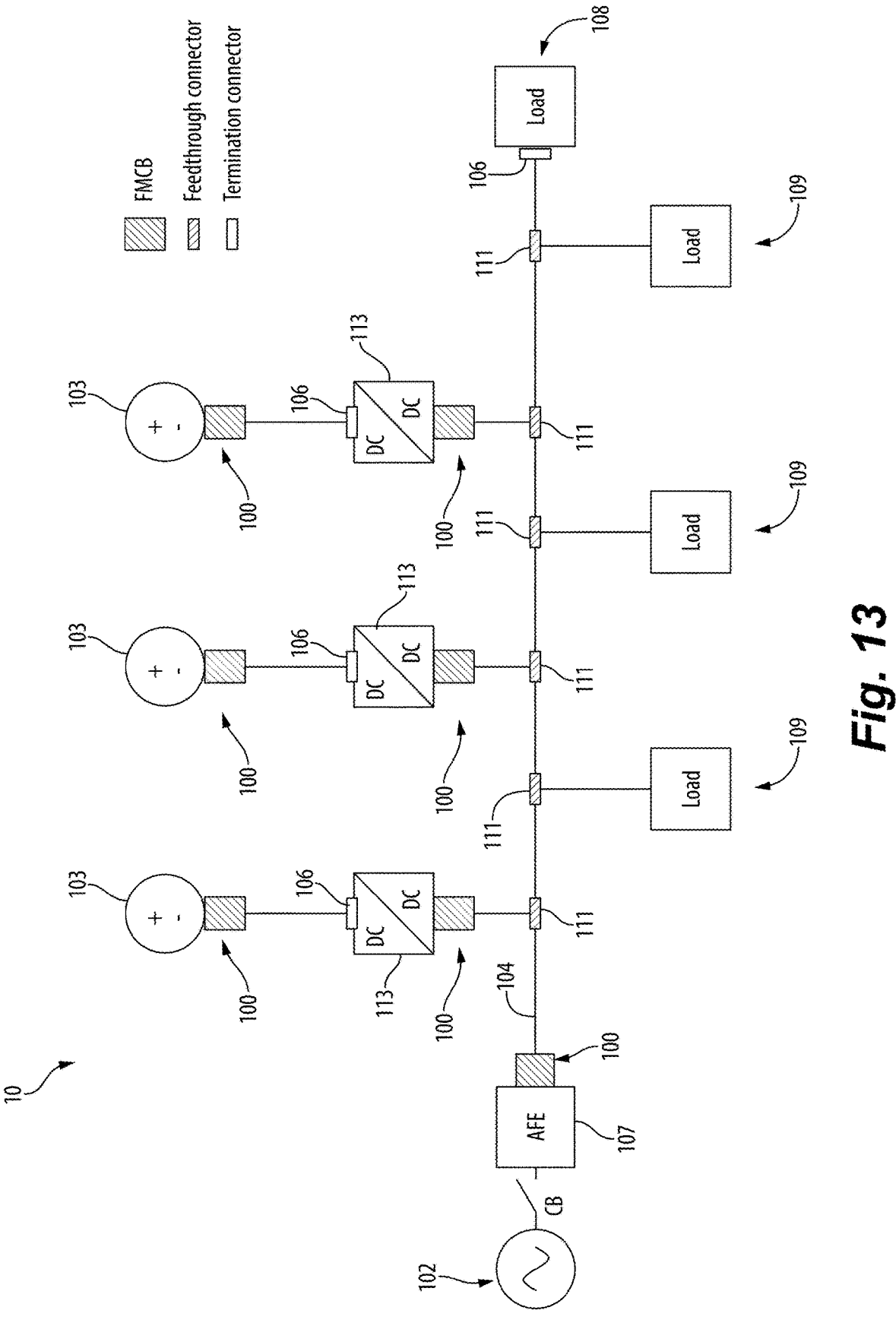
FIG. 13 is a schematic view of the system of FIG. 1, showing an application with multiple loads and power sources.

With reference now to FIG. 13, it is possible to incorporate systems 100 into a larger system 10 with multiple power sources 102, 103, including an AC source 102 connected to an active front end (AFE) 107 through a circuit breaker (CB). A system 100, e.g. as in FIG. 1, connects between the AFE 107 and the main transmission cable 104. Multiple DC sources 103 connect intermittently to the main transmission cable 104, each by way of a respective system 100, terminal connector 106 (as shown in FIG. 5), DC/DC converter 113, additional system 100, and feedthrough connector 111 in series. Multiple intermediate loads 109 can be connected to the main transmission cable 104 by respective feedthrough connectors 111. A terminal load 108 is connected to the main transmission cable 104 by a terminal connector 106 like the one shown in FIG. 5. Each instance of a system 100 shown in FIG. 13 can serve the function of a fault-managed circuit breaker (FMCB).

The methods and systems of the present disclosure, as described above and shown in the drawings, provide for fault managed power supply (FMPS) functionality for AC and DC systems including protection for faults such as shock faults due to human contact with power lines. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A system comprising:
a transmission cable including a connector at a load end of the transmission cable that is configured to connect the transmission cable electrically to a load to supply power from a power source to the load, wherein the transmission cable includes:
a first main conductor wire within a first wire insulator;
a sense wire wrapped around the first wire insulator with a sense resistor in series electrically with the sense wire;
one or more additional main conductor wires each including a respective conductor within a respective wire insulator; and
a cable insulator disposed around a bundle that includes the first main conductor wire, the sense wire, and the one or more additional main conductor wires; and
a protection system operatively connected to the transmission cable, wherein the protection system includes:
a leakage current sensor circuit (LCSC) operatively connected to the sense wire to provide feedback indicative of current in the sense wire; and
a controller operatively connected to provide feedback based control to a plurality of switching devices operatively connected to a first line and to one or more additional lines for fault protection, wherein the controller is operatively connected to receive the feedback indicative of current in the sense wire from the LCSC for feedback based control of the plurality of switching devices.

2. The system as recited in claim 1, wherein the protection system includes:
a first breaker device in the first line in electrical series between a first node configured to connect to the power source and the first main conductor wire; and
a second breaker device in a second line in electrical series between a second node configured to connect to the power source and a second main conductor wire that is one of the one or more additional main conductor wires.

3. The system as recited in claim 2, wherein the connector of the transmission cable includes a cable plug including:
a first plug terminal electrically connected to a connection end of the first main conductor wire;
one or more additional plug terminals respectively connected electrically to a connection end of each one of the one or more additional main conductor wires; and a sense plug terminal electrically connected to the sense wire, wherein the sense resistor is in electrical series between the sense plug terminal and the sense wire.

4. The system as recited in claim 3, further comprising a load plug configured to connect to the cable plug, the load plug comprising:

a first load terminal in electrical contact with the first plug terminal for conducting power from the first main conductor wire to a load;

one or more additional load terminals respectively in electrical contact with the one or more additional plug terminals for conducting power from the one or more additional main conductor wires to the load;

a load sense terminal in electrical contact with the sense plug terminal; and a jumper electrically connecting the first load terminal with the load sense terminal for conduction between the first main conductor wire and the sense wire through the sense resistor.

5. The system as recited in claim 2, wherein the sense wire includes insulated magnet wire and the sense wire is wrapped, with no spacing, around the first main conductor wire to form a shield.

6. The system as recited in claim 5, wherein the LCSC includes:

a voltage source;

a first LCSC resistor electrically in series between the sense resistor and the voltage source;

a second LCSC resistor electrically connected to a first LCSC node between the voltage source and the first LCSC resistor, wherein the second LCSC resistor electrically connects between the first LCSC node and ground;

a metal oxide varistor (MOY) electrically connected in parallel with the second LCSC resistor; and current sensing logic operatively connected to detect current passing through the first LCSC resistor and to output feedback indicative of current to the controller.

7. The system as recited in claim 2, wherein the plurality of switching devices includes:

a first switching device in the first line;

a second switching device in the second line that is one of the one or more additional lines;

a third switching device in a switch line connecting electrically between the first and second lines; and a fourth switching device in the switch line, electrically in series between the third switching device and the second line.

8. The system as recited in claim 7, wherein the protection system further comprises a main sensor operatively connected to the first and second lines to generate feedback for the controller indicative of current differential among the first and second lines, wherein the controller is operatively connected to control switching of the first, second, third, and fourth switching devices and to control the first and second breaker devices for fault protection based on feedback from the main sensor.

9. The system as recited in claim 8, wherein the controller includes machine readable instructions configured to cause the controller to:

check the integrity of the transmission cable and connection of the transmission cable to the load by measuring the current feedback from the LCSC;

upon detecting current within an expected range, and upon detecting current imbalance magnitude below a predetermined limit in feedback from the main sensor, close the first and second switching devices to power the load;

upon detecting current imbalance magnitude above the predetermined limit in feedback from the main sensor or upon detecting lack of current in the sense wire, open the first and second switching devices and close third and fourth switching devices to short out the transmission cable and shunt current away from the transmission cable, load, and possible fault;

initiate a fault indicator for a predetermined time;

after a fault, make a first attempt to restart including detecting current imbalance magnitude below a predetermined limit in feedback from the main sensor, and closing the first and second switching devices during a system voltage zero-crossing to power the load;

upon failure of the first attempt, repeatedly attempt to restart up to three times; and upon three failed attempts to restart, trip the first and second breaker devices.

10. The system as recited in claim 8, further comprising:

a first inrush limiter in the first line in electrical series between the first breaker device and the first switching device; and a second inrush limiter in the second line in series between the second breaker device and the second switching device, wherein the first and second inrush limiters are operatively connected to be controlled by the controller, and wherein the controller includes machine readable instructions configured to cause the controller to perform DC fault managed power supply (FMPS) functionality in the protection system for the power source and load.

11. The system as recited in claim 10, wherein the first inrush limiter includes a first inrush resistor in parallel with a first solid state inrush switch, each connected in electrical series in the first line between the first breaker device and the first switching device, wherein the second inrush limiter includes a second inrush resistor in parallel with a second solid state inrush switch, each connected in electrical series in the second line between the second breaker device and the second switching device.

12. The system as recited in claim 11, further comprising:

a ground line in the protection system configured to be electrically connected to a ground, wherein the ground line is connected to a node in electrical series between the first and second solid state inrush switches, but circumvents the main sensor, wherein the one or more additional main conductor wires includes a ground conductor wire electrically connected to the ground line.

13. The system as recited in claim 11, wherein the controller includes machine readable instructions configured to cause the controller to:

check the integrity of the transmission cable and connection of the transmission cable to the load by measuring the current feedback from the LCSC;

upon detecting current within an expected range, and upon detecting current imbalance magnitude below a predetermined limit in feedback from the main sensor, close the first and second switching devices;

after a predetermined inrush time, command the first and second solid state inrush switches to close, shunting the first and second inrush resistors;

upon detecting current imbalance magnitude above the predetermined limit in feedback from the main sensor or upon detecting lack of current in the sense wire, open the first and second switching devices and close third and fourth switching devices to short out the transmission cable and shunt current away from the transmission cable, load, and possible fault, and open the first and second solid state inrush switches;

initiate a fault indicator for a predetermined timeout time;

after a fault, make a first attempt to restart including detecting current imbalance magnitude below a predetermined limit in feedback from the main sensor, and closing the first and second switching devices to power the load;

upon failure of the first attempt, repeatedly attempt to restart up to three times; and upon three failed attempts to restart, trip the first and second breaker devices.

14. The system as recited in claim 8, further comprising:

a first inrush resistor in the first line in electrical series between the first breaker device and the first switching device; and a second inrush resistor in the second line in series between the second breaker device and the second switching device, wherein the controller includes machine readable instructions configured to cause the controller to use pulse width modulation (PWM) control of the first and second switching devices to charge load capacitance for inrush control.

15. The system as recited in claim 14, wherein the controller includes machine readable instructions configured to cause the controller to perform DC fault managed power supply (FMPS) functionality in the protection system for the power source and load.

16. The system as recited in claim 8, further comprising:

a first inrush limiter in the first line in electrical series between the first breaker device and the first switching device; and a second inrush limiter in the second line in series between the second breaker device and the second switching device, wherein the first and second inrush limiters are operatively connected to be controlled by the controller, and wherein the first inrush limiter includes a first inrush switching device in electrical series between the first breaker device and the first switching device, wherein the second inrush limiter includes a second inrush switching device in electrical series between the second breaker device and the second switching device, wherein the controller includes machine readable instructions configured to cause the controller to:

use pulse width modulation (PWM) control of the first and second inrush switching devices during startup to limit inrush.

17. The system as recited in claim 8, further comprising:

a first inrush limiter in the first line in electrical series between the first breaker device and the first switching device; and a second inrush limiter in the second line in series between the second breaker device and the second switching device, wherein the first and second inrush limiters are operatively connected to be controlled by the controller, and wherein the first inrush limiter includes a first inrush switching device in electrical series between the first breaker device and the first switching device, wherein the second inrush limiter includes a second inrush switching device in electrical series between the second breaker device and the second switching device, wherein the controller includes machine readable instructions configured to cause the controller to:

modulate MOSFET resistance in the first and second inrush switching devices by modulating gate voltage to limit current magnitude.

18. The system as recited in claim 8, wherein the first line includes a positive single pair ethernet in (SPE-IN+) node between the third switching device and the main sensor, wherein the second line includes a negative single pair ethernet in (SPE-IN−) node between the fourth switching device and the main sensor, and further comprising:

a single pair ethernet (SPE) RX/TX component operatively connected to the SPE-IN+ and SPE-IN− nodes to communicate data through the transmission cable.

19. A system comprising:

a power source;

a transmission cable including a connector at a load end of the transmission cable that is configured to connect the transmission cable electrically to a load to supply power from the power source to the load, wherein the transmission cable includes:

a first main conductor wire within a first wire insulator;

a sense wire wrapped around the first wire insulator with a sense resistor in series electrically with the sense wire; and one or more additional main conductor wires each including a respective conductor within a respective wire insulator;

a leakage current sensor circuit (LCSC) operatively connected to the sense wire and configured to provide feedback indicative of current in the sense wire; and a controller configured to:

provide feedback based control to a plurality of switching devices operatively connected to a first line and to one or more additional lines of the transmission cable; and receive the feedback indicative of current in the sense wire from the LCSC for feedback based control of the plurality of switching devices.

20. A method comprising:

electrically connecting a transmission cable to a load to supply power from a power source to the load, the transmission cable including a connector at a load end of the transmission cable that is configured to connect the transmission cable electrically to the load, wherein the transmission cable includes:

a first main conductor wire within a first wire insulator;

a sense wire wrapped around the first wire insulator with a sense resistor in series electrically with the sense wire;

one or more additional main conductor wires each including a respective conductor within a respective wire insulator; and a cable insulator disposed around a bundle that includes the first main conductor wire, the sense wire, and the one or more additional main conductor wires;

providing, using a leakage current sensor circuit (LCSC) operatively connected to the sense wire, feedback indicative of current in the sense wire; and providing, using a controller, feedback based control to a plurality of switching devices operatively connected to a first line and to one or more additional lines for fault protection, wherein the controller is operatively connected to receive the feedback indicative of current in the sense wire from the LCSC for feedback based control of the plurality of switching devices.

* * * * *